United States Patent
Takaya

(10) Patent No.: US 7,371,635 B2
(45) Date of Patent: May 13, 2008

(54) SEMICONDUCTOR DEVICE AND METHOD OF MANUFACTURING THE SAME

(75) Inventor: Koji Takaya, Minato-ku (JP)

(73) Assignee: Oki Electric Industry Co., Ltd., Tokyo (JP)

(*) Notice: Subject to any disclaimer, the term of this patent is extended or adjusted under 35 U.S.C. 154(b) by 18 days.

(21) Appl. No.: 10/897,029

(22) Filed: Jul. 23, 2004

(65) Prior Publication Data
US 2005/0139881 A1    Jun. 30, 2005

(30) Foreign Application Priority Data
Dec. 26, 2003   (JP)   ............................ 2003-431726

(51) Int. Cl.
*H01L 21/8242*    (2006.01)

(52) U.S. Cl. ...................................... 438/239; 438/393

(58) Field of Classification Search ................ 438/118, 438/3, 250, 393, 238, 239, 386, 399, 152, 438/155, 156, 309, 311, 190, 210, 253, 254, 438/381, 397; 257/295, 350, 300, 296, 297, 257/303, 306
See application file for complete search history.

(56) References Cited

U.S. PATENT DOCUMENTS 5,786,638 A * 7/1998 Yamaha ...................... 257/760
6,781,184 B2 * 8/2004 Solayappan et al. ........ 257/310

FOREIGN PATENT DOCUMENTS

JP    07-050391 A    2/1995
JP    2003-100994 A    4/2003

* cited by examiner

*Primary Examiner*—Hoai V Pham
*Assistant Examiner*—Dilinh Nguyen
(74) *Attorney, Agent, or Firm*—Volentine & Whitt, P.L.L.C.

(57) ABSTRACT

A method of manufacturing a semiconductor device includes: forming a transistor with first and second ends of a main current path, and a control electrode, covering the transistor with a first insulating film, forming first through third openings that expose the first and second ends and the control electrode, and burying or filling first to third conductive materials in the first to third openings respectively, forming the ferroelectric capacitor by laminating the first electrode, the ferroelectric film, and the second electrode, laminating the second insulating film and the moisture diffusion protective film, forming the fourth opening to expose the third conductive material through the second insulating film and the moisture diffusion protective film, and forming a first wiring layer, which has electrical connection with the control electrode.

20 Claims, 5 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same. More specifically, the present invention relates to a semiconductor device with a ferroelectric capacitor and method of manufacturing the same.

2. Background Information

Related examples of a semiconductor device with a ferroelectric capacitor are described in Japanese Patent Publications JP-A-2003-100994 and JP-A-1995-50391, which are hereby incorporated by reference. The former document describes a semiconductor device. Japanese Patent Publication JP-A-2003-100994 also discloses a semiconductor device that has a transistor, a ferroelectric capacitor, and a first wiring layer (IM). The transistor is formed on a semiconductor substrate. The ferroelectric capacitor is formed on a transistor via a first insulating layer. The first wiring layer (1M) is formed on the ferroelectric capacitor via a second insulating layer. Furthermore, JP-A-2003-100994 discloses a moisture diffusion protective film composed of $Si_3N_4$ and SiON formed on the first wiring layer. The structure of this semiconductor device allows a moisture diffusion protective film on the first wiring layer to prevent moisture generated in the manufacturing process from intruding into the ferroelectric capacitor.

On the other hand, Japanese Patent Publication JP-A-1995-50391 describes a semiconductor device. This semiconductor device also has a transistor, a ferroelectric capacitor, and a first wiring layer (IM). The transistor is formed on a semiconductor substrate. The ferroelectric capacitor is formed on the transistor via a first insulating layer. The first wiring layer (1M) is formed on the ferroelectric capacitor via a second insulating layer. Furthermore, JP-A-1995-50391 also discloses a silicon oxide film to which phosphorus is added and a silicon oxide film to which phosphorus is not added (a moisture diffusion protective film) that are laminated in that order. The structure of this semiconductor device allows for stress of a ferroelectric capacitor to be reduced and the intrusion of impurities to be blocked by the silicon oxide film to which phosphorus is added. Furthermore, moisture resistance and water resistance are ensured by the silicon oxide film to which phosphorus is not added.

In the case of a semiconductor device described in JP-A-2003-100994, the moisture diffusion protective film is mainly formed by reactive sputtering. A high power sputter power is applied to a target in this sputtering. Charged particles generated in plasma by the high power sputter electrize charges in a moisture diffusion protective film. These charges are accumulated in a gate electrode of a transistor via the first wiring layer under the moisture diffusion protective layer. This structure and process generate voltage between the gate electrode and the semiconductor substrate. Thus, damage resulting from the charging, which decreases breakdown voltage of a gate-insulating layer can become a problem.

In addition, in the types semiconductor devices described in both of the patent documents, there is a high possibility that moisture is generated when forming the first wiring layer, especially in an ashing process in which resist is removed after metal etching. There is a possibility that moisture generated in the ashing process could intrude into the ferroelectric capacitor at this point, because a moisture diffusion protective film is formed after the first wiring layer is formed. Given this structure and process, moisture intrusion can adversely affect the properties of the ferroelectric capacitor.

In view of the above, it will be apparent to those skilled in the art from this disclosure that there exists a need for an improved semiconductor device and a method of manufacturing the same. This invention addresses this need in the art as well as other needs, which will become apparent to those skilled in the art from this disclosure.

SUMMARY OF THE INVENTION

An object of the present invention is to prevent charging damage for a transistor while forming a moisture diffusion protective layer, and to provide a method of manufacturing a semiconductor device that inhibits moisture intrusion into a ferroelectric capacitor while forming a first wiring layer.

A manufacturing method of a semiconductor device in accordance with a first aspect of the present invention includes forming a transistor, covering the transistor with a first insulating layer, forming a ferroelectric capacitor, covering the ferroelectric capacitor with a second insulating layer, depositing or forming a moisture diffusion protective film on the second insulating layer, forming a fourth opening on the main current path, and forming a first wiring layer. The transistor is formed to have a first end on a main current path, a second end on the main current path, and a control electrode. Further, first through third openings are formed to expose respectively the first end of the main current path, the second end of the main current path, and the control electrode. Moreover, first through third conductive materials are respectively buried or filled in the first through third openings. The ferroelectric capacitor is formed by laminating a first electrode, a ferroelectric film, and a second electrode on the first insulating layer. The fourth opening exposes the third conductive material through the second insulating layer and the moisture diffusion protective film. The first wiring layer has an electrical connection with the control electrode through the fourth opening and via the third conductive material. Further, the first wiring layer is formed on the moisture diffusion protective film.

In the method of manufacturing a semiconductor device in accordance with the present invention, the first wiring layer is connected to the control electrode (e.g., gate-electrode), and is formed after the moisture diffusion protective film is formed. Further, the moisture diffusion protective film covers the ferroelectric capacitor via a first insulating layer. Therefore, moisture generated in forming the first wiring layer, especially in the ashing process that removes resist after metal etching, is blocked by the moisture diffusion protective film, and moisture intrusion into the ferroelectric capacitor can be inhibited or prevented entirely.

On the other hand, the first wiring layer is not formed until after the forming of the moisture diffusion protective film, and there is no other electrical connection between the moisture diffusion protective film and the control electrode because of the existence of the second insulating layer. Therefore, during exposure to high power plasma, such as in a case in which the moisture diffusion protective film is formed by reactive sputter, charged particles are prevented from intruding into the control electrode, and charging damage to the transistor can be inhibited or prevented entirely.

These and other objects, features, aspects, and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

Figure 3:
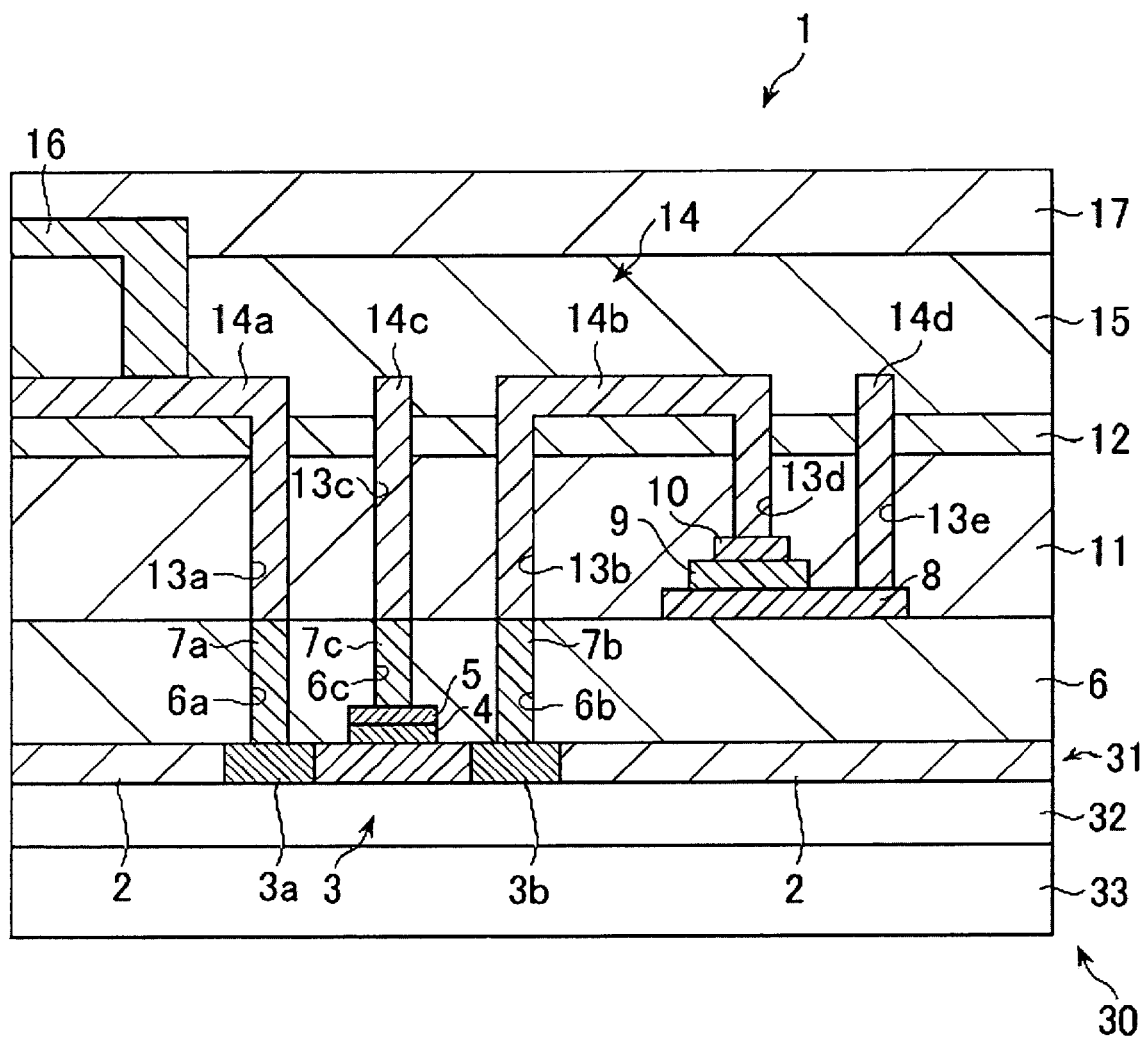
FIG. 3 is a cross-sectional diagrammatical view even further illustrating the method of manufacturing a semiconductor device in accordance with the first embodiment of the present invention.

FIG. 3 is a cross-sectional diagrammatical view of a semiconductor device 1 in accordance with a first embodiment of the present invention. The semiconductor device 1 is a ferroelectric memory device with a planar-typed ferroelectric capacitor. The device has a transistor and a ferroelectric capacitor. The transistor is formed in an active region 3 separated by a device isolation insulating layer 2. The ferroelectric capacitor is formed on an interlayer insulating layer (first insulating layer) 6 covering the transistor on a semiconductor substrate or on a SOI (silicon on insulator) substrate 30. The SOI substrate 30 includes a silicon layer 31 in which the device isolation insulating layer 2 is formed, an insulating layer (e.g. an oxide layer) 32, and a support substrate 33. The support substrate 33 is preferably made of silicon.

The transistor is composed of source drain regions 3a and 3b, a gate-insulating film 4, and a gate electrode 5. The source drain regions 3a and 3b are formed in an active region 3. The gate-insulating film 4 and the gate electrode 5 are formed on a portion of the active region 3 located in between the source drain regions 3a and 3b. The source drain regions 3a and 3b respectively correspond to the first and second ends of main current paths. Further, the gate-electrode 5 corresponds to a control electrode. The interlayer insulating layer 6 is formed to cover the transistor. Openings 6a, 6b, and 6c are formed in the insulating layer 6. The openings 6a, 6b, and 6c respectively expose the source drain regions 3a and 3b, and the gate-electrode 5. Contact plugs (first, second, and third conductive materials) 7a, 7b, and 7c are respectively buried or filled in the openings 6a, 6b, and 6c. The contact plugs 7a, 7b, and 7c are composed of conductive material. A lower electrode (first electrode) 8 is arranged on the interlayer insulating layer 6. Further, a ferroelectric film 9 is arranged on the lower electrode 8. Moreover, an upper electrode (second electrode) 10 is arranged on the ferroelectric film 9. The ferroelectric capacitor is formed by laminating the lower electrode 8, the ferroelectric film 9, and the upper electrode 10 in that order. Further, the lower electrode 8 is projected outward from the ferroelectric film 9 and the upper electrode 10 to obtain conduction from above.

The ferroelectric capacitor is covered with an interlayer insulating layer (second insulating layer) 11. Furthermore, a moisture diffusion protective film 12 is formed on the entire upper surface of the interlayer insulating layer 11. That is, the moisture diffusion protective film 12 covers the ferroelectric capacitor via, i.e., by covering, the interlayer insulating layer 11. Openings 13a, 13b, 13c, 13d, and 13e are formed in the moisture diffusion protective film 12 and the interlayer insulating layer 11. The openings 13b and 13d can be respectively viewed as fifth and sixth openings. The opening 13c can be viewed as a fourth opening.

A first wiring layer (1M) 14 is formed on the moisture diffusion protective film 12. The first wiring layer (1M) 14 has an electrical connection with the transistor and the ferroelectric capacitor through the openings 13a through 13e. The first wiring layer 14 includes wiring 14a, 14b, 14c, and 14d. The wiring 14a has an electrical connection with the source drain region 3a through the opening 13a and via the contact plug 7a, and is connected with a bit-line that is not shown in the diagram. The wiring 14b has an electrical connection with the source drain region 3b of the transistor through the opening 13b and via the contact plug 7b. Furthermore, the wiring 14b has an electrical connection with the upper electrode 10 of the ferroelectric capacitor through the opening 13d. The wiring 14c has an electrical connection with the gate-electrode 5 through the opening 13c and via the contact plug 7c. The wiring 14d has an electrical connection with the lower electrode 8 of the ferroelectric capacitor through the opening 13e. Further, the wiring 14d has an electrical connection with a plate line that is not shown in the diagram. In addition, an interlayer insulating layer (third insulating layer) 15 is formed to cover the first wiring layer 14.

A second wiring layer (2M) 16, which has an electrical connection with the first wiring 14 through an opening, is formed on the interlayer insulating layer 15. Furthermore, the second wiring layer (2M) 16 is covered by a protective layer 17.

Figure 1:
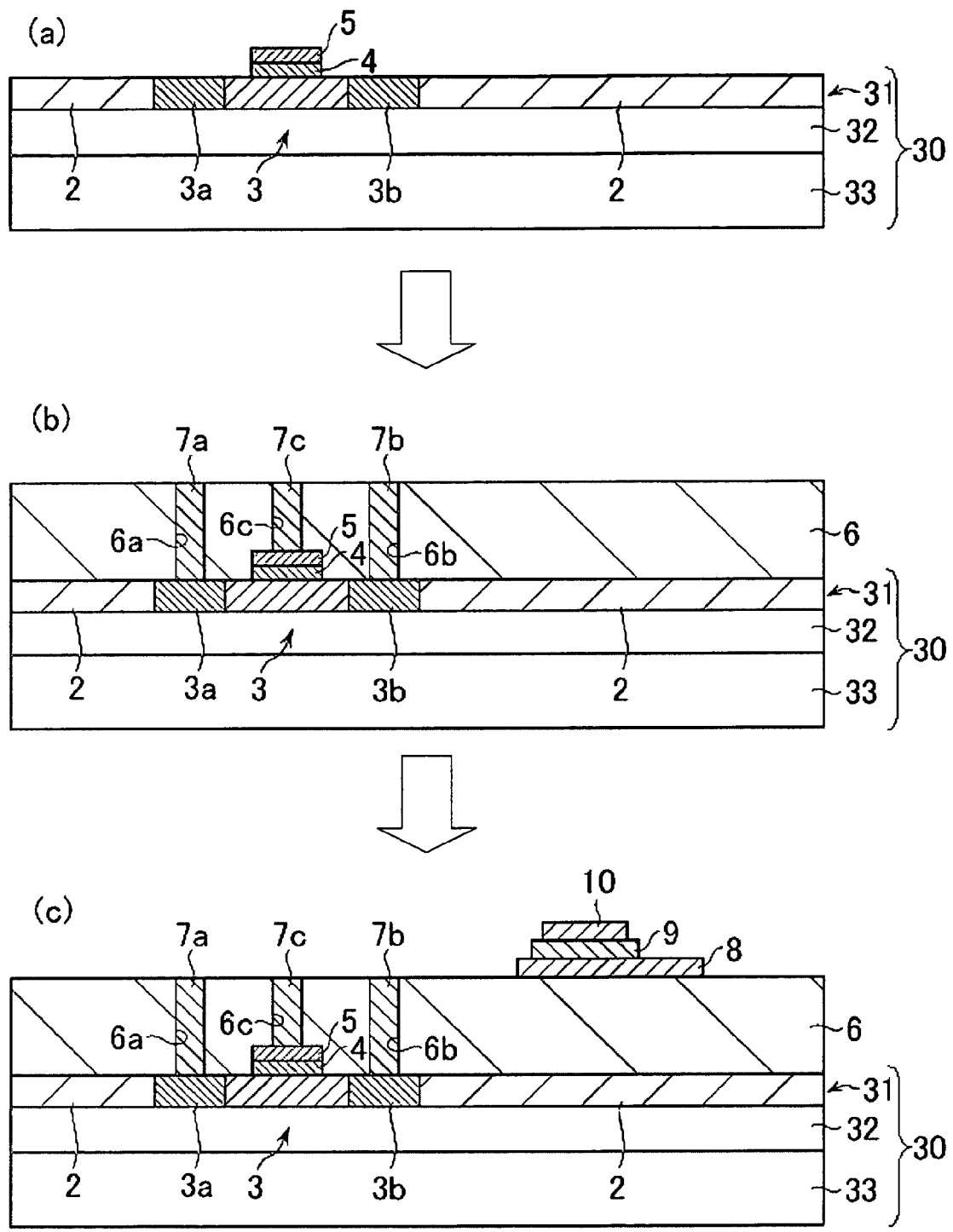
FIG. 1 is a view of cross-section diagrams illustrating a method of manufacturing a semiconductor device in accordance with a first preferred embodiment of the present invention.
Figure 2:
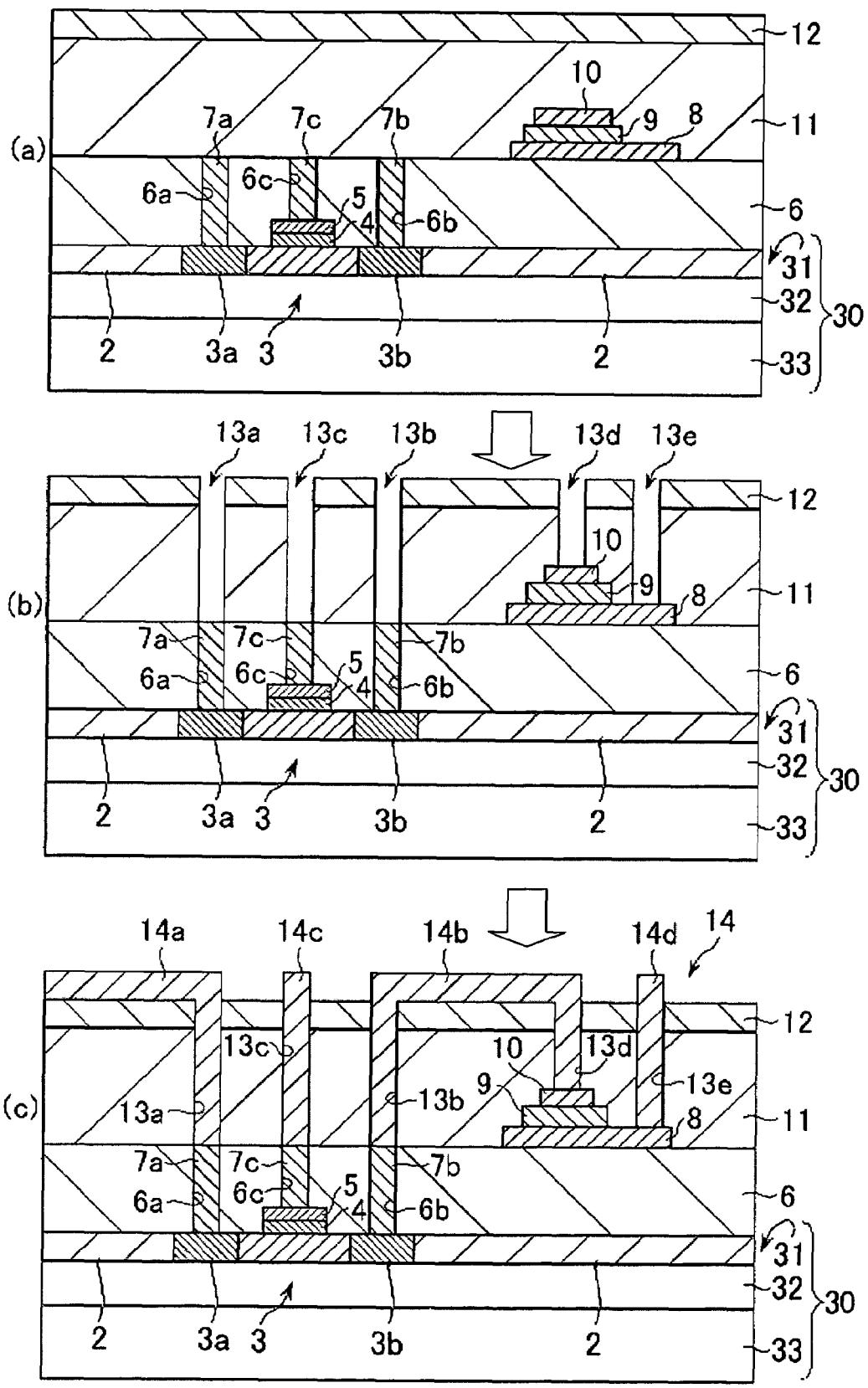
FIG. 2 is a view of cross-section diagrams further illustrating the method of manufacturing a semiconductor device in accordance with the first embodiment of the present invention.

The following is a description of a method of manufacturing the semiconductor device 1 in accordance with the instant embodiment of the present invention with reference to FIGS. 1 through 3.

For example, as is shown in FIG. 1(a), the device isolation insulating layer 2 is composed of an oxide film is formed on a semiconductor layer of SOI substrate. In addition, to control the threshold voltage of the transistor, the active region 3 is formed by selective ion implantation and activation of N-typed or P-typed impurities. Then, the gate-insulating film 4 and the gate electrode 5 are formed by depositing an insulating layer (e.g., an oxide film) and an electrode material composed of polycrystalline silicon in this order and patterning them with photolithoetching. After this, the source drain regions 3a and 3b are formed in the active region 3 by ion implantation of P-typed or N-taped impurities into the corresponding portion of the active region 3.

Next, as shown in FIG. 1(b), the interlayer insulating layer 6 is formed by depositing an oxide film or a nitride film by a CVD method. Then, the openings 6a, 6b, and 6c, which expose the source drain regions 3a and 3b and gate-electrode 5, are formed by photolithoetching. In addition, the contact plugs 7a, 7b, and 7c are formed by respectively burying or filling tungsten (W) in the opening 6a, 6b, and 6c by a CVD method. The contact plugs 7a and 7b are connected with the source drain regions 3a and 3b respectively, and the contact plug 7c is connected with the gate-electrode 5.

Next, as shown in FIG. 1(c), the lower electrode 8, the ferroelectric film 9, and the upper electrode 10 are formed by depositing Pt film, SBT (SrBiTa2O9) film, and Pt film in this order on the interlayer insulating layer 6, and patterning them by photolithoethcing. The patterning is conducted such that the lower electrode 8 is the longest of the three and the upper electrode 10 is the shortest. The ferroelectric film 9 can be PZT ($Pb(Zr_xO_{1-x})$), SBTN ($SrBi_2(Ta,Nb)_2O_9$), or BLT ($(Bi, La)_4Ti_3O_{12}$). In addition, the lower electrode 8 and the upper electrode 10 can be made of a material that does not contain Pt, such as Iridium (Ir) or an Iridium alloy.

Next, as shown in FIG. 2(a), the interlayer insulating layer 11 is formed by depositing an oxide film or a nitride film on the interlayer insulating layer 6 by a CVD method. Then, the moisture diffusion protective film 12 is formed by depositing silicon nitride (SiN) on the interlayer insulating layer 11 by a reactive sputtering method. The reactive sputter is conducted by two-staged RF power in a nitrogen atmosphere with a silicon (Si) target. For example, the RF power is set as 1 kW in the early stage, and is set as 1.6 kW in the next stage. The value of the RF power is determined so that the moisture diffusion protective film 12 sufficiently works after its formation. In addition, the gate-electrode 5 and the contact plug 7c are insulated from the moisture diffusion protective film 12 by the interlayer insulating layer 11 because the interlayer insulating film 11 is formed before the moisture diffusion protective film 12 is deposited. Therefore, the accumulation of charges in the gate-electrode 5 can be inhibited, even if, in a sputter process of the moisture diffusion protective film 12 high sputter power is applied and charged particles in plasma electrize charges in the moisture diffusion protective film 12. As a result, charging damage to the transistor can be inhibited or avoided completely. Also, RF power is initially set at 1 kW and escalated to 1.6 kW thereafter because there is a possibility that the high sputter power could damage the layers located under the interlayer insulating film 11 in the early stage of deposition processing of the moisture diffusion protective film 12. It is preferred that the moisture diffusion protective film 12 is composed of $Si_3N_4$ or SiON in view of its caustic or otherwise corroding resistance against moisture and/or heat in various manufacturing processes.

Next, as shown in FIG. 2(b), the openings 13a-13e are formed. The openings 13a-13e respectively expose the contact plugs 7a, 7b, and 7c, the upper electrode 10, and the interlayer insulating film 11 and the lower electrode 8 by photolithoetching the moisture diffusion protective film 12.

Next, as shown in FIG. 2(c), the first wiring layer 14 composed of the wiring 14a-14d is formed by depositing an aluminum compound by a sputtering method and photolithoetching the aluminum compound layer.

In addition, as shown in FIG. 3, the second wiring layer 16 is formed by a process by forming the interlayer insulating layer 15, creating an opening in the interlayer insulating layer 15 to expose at least part of the first wiring layer 14, and depositing an aluminum alloy thereon. The interlayer insulating layer 15 is formed by depositing an oxide film or a nitride film on the entire surface of the first wiring layer 14 by a CVD method. The opening that exposes the first wiring layer 14 is formed in the interlayer insulating layer 15 by photolithoetching. The aluminum alloy is deposited by a sputter method, and the aluminum compound film is photolithoetched to form the second wiring layer 16. In addition, the protective film 17 that covers the second wiring layer 16 is formed.

According to the method of manufacturing the semiconductor device in accordance with the present embodiment, the first wiring layer 14 is not formed before forming the moisture diffusion protective film 12. Therefore, as shown in FIG. 2(a), the gate-electrode 6 and the contact plug 7c are totally insulated from the moisture diffusion protective film 12 by the interlayer insulating layer 11. Therefore, accumulation of charges in the gate-electrode 5 can be inhibited, even if, high sputter power is applied and charged particles in plasma electrize charges in the moisture diffusion protective film 12. This is because the gate-electrode 5 and the moisture diffusion protective film 12 are insulated from each other by the interlayer insulating layer 11. As a result, charging damage to the transistor can be inhibited or avoided completely.

In addition, moisture generated in a process after forming the first wiring layer 14 can be blocked from the ferroelectric capacitor. Furthermore, moisture generated in forming the first wiring layer 14 can also be blocked from the ferroelectric capacitor because the moisture diffusion protective film 12 is formed before forming the first wiring layer 14. That is, since the ferroelectric capacitor is already covered with the moisture diffusion protective film 12 as shown in FIGS. 2(a), 2(b), and 2(c), in forming the first wiring layer 14, especially when using a process of ashing resist after etching of the first wiring layer 14, moisture generated in the resist-ashing process is blocked by the moisture diffusion protective film 12, and moisture intrusion into the ferroelectric capacitor is inhibited. Due to this structure, property deterioration of the ferroelectric capacitor by moisture generated in the resist-ashing process in forming first wiring layer 14 can be inhibited or avoided completely.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

Second Embodiment

A second embodiment will now be explained. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 5:
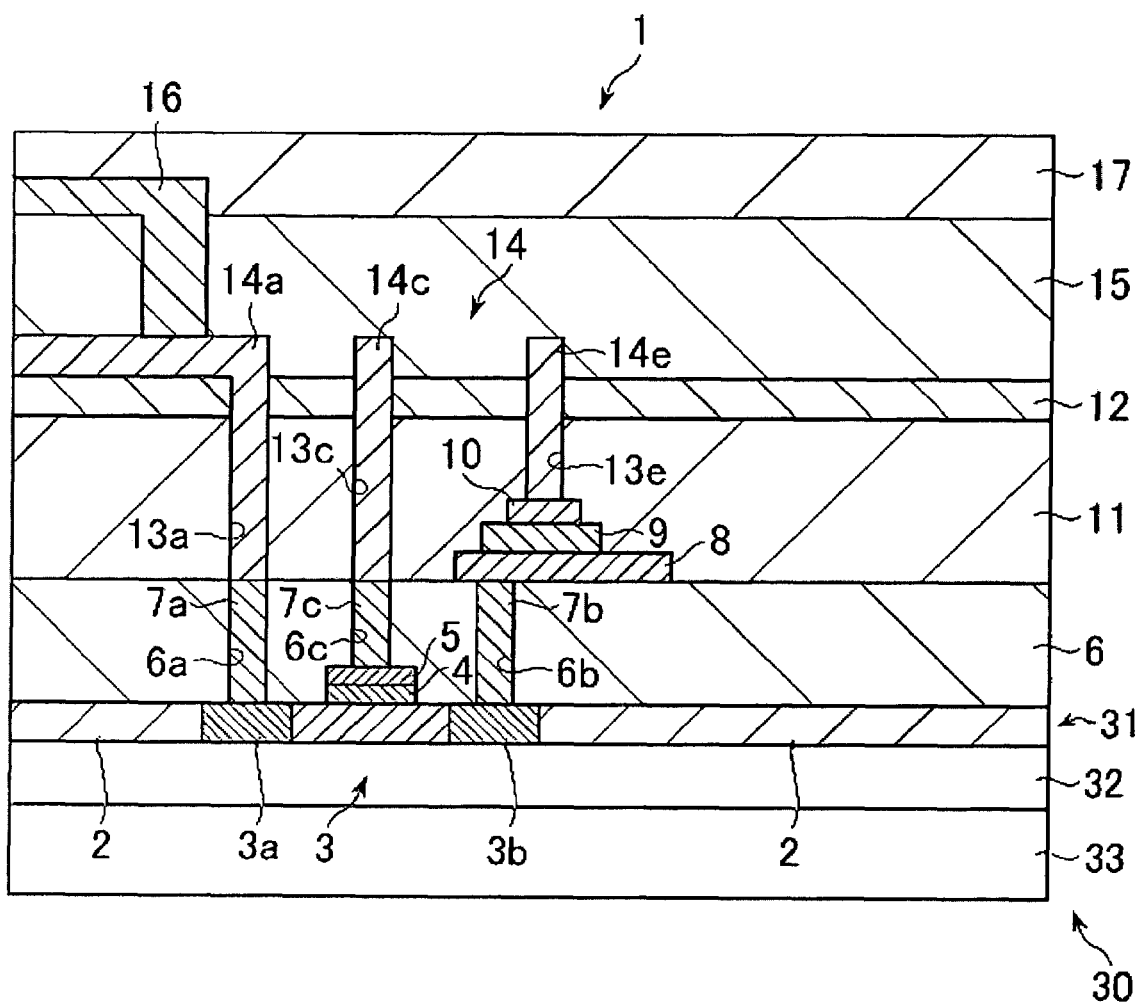
FIG. 5 is a cross-section diagrammatical view further illustrating the method of manufacturing a semiconductor device in accordance with the second embodiment of the present invention.

FIG. 5 is a cross-section diagrammatical view of semiconductor device 1 in accordance with a second embodiment of the present invention. The semiconductor device 1 of the second embodiment is a ferroelectric memory device with a stack typed ferroelectric capacitor. The present embodiment is different from the first embodiment in that the lower electrode 8 of the ferroelectric capacitor is formed on the contact plug 7b, which is located in the interlayer insulating layer 6. That is, the lower electrode 8 of the ferroelectric capacitor has a direct electrical connection with the contact plug 7b without using the first wiring layer 14.

Figure 4:
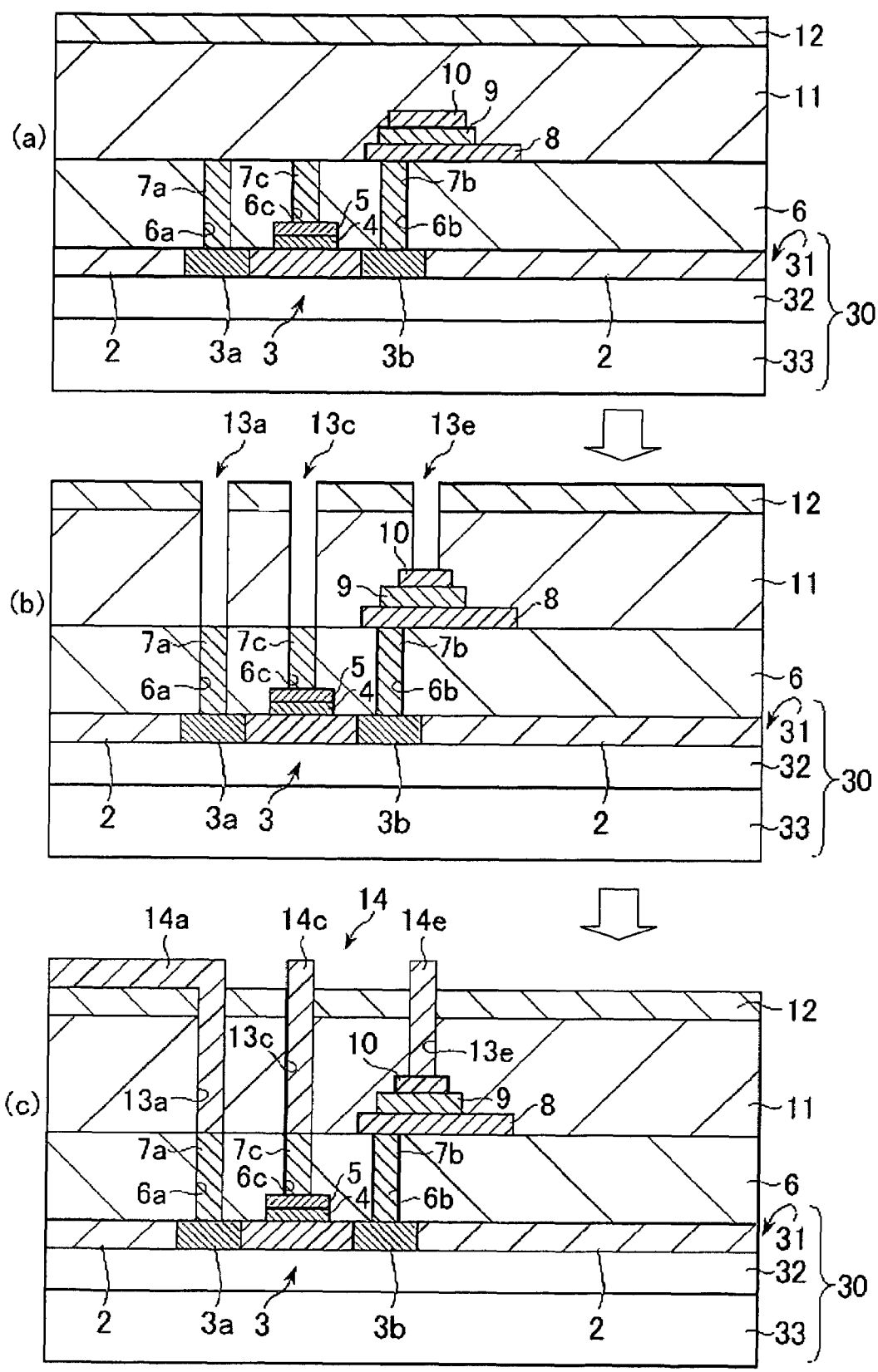
FIG. 4 is a view of cross-section diagrams illustrating a method of manufacturing a semiconductor device in accordance with a second embodiment of the present invention.

The following is a description of the method of manufacturing the semiconductor device 1 according to the second embodiment of the present invention with reference to FIGS. 4 and 5. The lower electrode 8, the ferroelectric film 9, and the upper electrode 10 are formed by laminating a Pt film, a $SrBiTa_2O_9$ (SBT) film, and a Pt film in that order on the contact plug 7b similar to or exactly the same as the process described with reference to FIG. 1(b). The lower electrode 8, the ferroelectric film 9, and the upper electrode 10 are patterned by photolithoetching so that the lower electrode 8 remains on the contact plug 7b (see FIG. 4(a)). In addition, the interlayer insulating layer 11 is formed by depositing an oxide film or a nitride film on the interlayer insulating film 6 by a CVD method. Then, the moisture diffusion protective film 12 is formed by depositing silicon nitride (SiN) on the interlayer insulating layer 11 by a reactive sputtering method.

Next, as shown in FIG. 4(b), the openings 13a, 13b, and 13e are formed by photolithoetching the moisture diffusion protective film 12 and the interlayer insulating layer 11. The openings 13a, 13b, and 13c respectively expose the contact plugs 7a and 7c, and the upper electrode 10. In the present embodiment, an opening that exposes the contact plug 7b and an opening that exposes the lower electrode 8 are not required to be formed, because the contact plug 7b and the lower electrode 8 are directly connected.

Next, as shown in FIG. 4(c), the first wiring layer 14 composed of the wirings 14a, 14c, and 14e is formed by depositing an aluminum compound by a sputtering method and photolithoetching aluminum compound layer. In the present embodiment, the wiring that connects to the plug 7b and the wiring that connects to the lower electrode 8 are not required to be formed because contact plug 7b and lower electrode 8 are directly connected.

In addition, as shown in FIG. 5, the second wiring layer 16 is formed by a process that includes forming the interlayer layer 15, creating an opening in the interlayer insulating layer 15 to expose at least a portion of the first wiring layer 14, and depositing an aluminum alloy film to form the second wiring layer 16. The interlayer insulating layer 15 is formed by depositing an oxide film or a nitride film on the first wiring layer 14 by a CVD method. The opening that exposes the first wiring layer 14 is formed on the interlayer insulating layer 15 by photolithoetching. Further, the aluminum alloy film is deposited by sputtering method, and the aluminum compound film is photolithoetched. In addition, the protective film 17 that covers the second wiring layer 16 is formed.

According to the method of manufacturing the semiconductor device of the present embodiment, charging damage to the transistor can be inhibited or entirely prevented for the same reasons explained in the first embodiment of the present invention. Even if high sputter power is applied and charged particles in plasma electrize charges in the moisture diffusion protective film 12 in a sputter process of the moisture diffusion protective film 12 accumulation of charges in the gate-electrode 5 can be inhibited. In addition, similar to or the same as the first embodiment, property deterioration of the ferroelectric capacitor by moisture generated in the resist ashing process in forming the first wiring layer 14 can be inhibited or avoided entirely.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2003-431726. The entire disclosure of Japanese Patent Application No. 2003-431726 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of manufacturing a semiconductor device comprising:

forming a transistor having a source region, a drain region, and a control electrode;

covering said transistor with a first insulating layer;

forming first through third openings in said first insulating layer to expose respectively said source region, said drain region, and said control electrode;

burying respectively first through third conductive materials in said first through third openings;

forming a ferroelectric capacitor by laminating a first electrode, a ferroelectric film, and a second electrode on said first insulating layer;

covering said ferroelectric capacitor with a second insulating layer;

forming a moisture diffusion protective film on said second insulating layer;

forming a fourth opening to expose said third conductive material through said second insulating layer and said moisture diffusion protective film;

forming a fifth opening to expose said second electrode of the ferroelectric capacitor through said second insulating layer and said moisture diffusion protective film; and forming a first wiring layer on said moisture diffusion protective film, the first wiring layer having an electrical connection with said control electrode through said fourth opening and via said third conductive material and having an electrical connection with said second electrode of the ferroelectric capacitor through said fifth opening, wherein said forming the first wiring layer occurs after said forming the moisture diffusion protective film.

2. The method of manufacturing a semiconductor device according to claim 1, wherein nitride is formed by a reactive sputtering method during said forming the moisture diffusion protective film.

3. The method of manufacturing a semiconductor device according to claim 1, further comprising forming a sixth opening through said second insulating layer and said moisture diffusion protective film to expose said second conductive material, and wherein said drain region is electrically connected to said second electrode by said first wiring layer via said second conductive material through said fifth and sixth openings.

4. The method of manufacturing a semiconductor device according to claim 3, further comprising, forming a third insulating layer on said first wiring layer.

5. The method of manufacturing a semiconductor device according to claim 4, further comprising:

forming a third insulating layer opening in said third insulating layer to expose at least a portion of said first wiring layer, and forming a second wiring layer in said third insulating layer opening.

6. The method of manufacturing a semiconductor device according to claim 5, further comprising forming a protective film on said third insulating layer.

7. The method of manufacturing a semiconductor device according to claim 1, wherein said first electrode is formed on said second conductive material, and said first electrode has an electrical connection with said drain region via said second conductive material.

8. The method of manufacturing a semiconductor device according to claim 7, further comprising, forming a third insulating layer on said first wiring layer.

9. The method of manufacturing a semiconductor device according to claim 8, further comprising:

forming a third insulating layer opening in said third insulating layer to expose at least a portion of said first wiring layer, and forming a second wiring layer in said third insulating layer opening.

10. The method of manufacturing a semiconductor device according to claim 9, further comprising forming a protective film on said third insulating layer.

11. A method of manufacturing a semiconductor device comprising:

forming a transistor on a substrate;

forming a first interlayer insulating layer over the transistor and the substrate;

forming a first contact through the first interlayer insulating layer to the transistor;

forming a capacitor over the first interlayer insulating layer;

forming a second interlayer insulating layer over the capacitor and the first interlayer insulating layer;

forming a moisture diffusion protection film on the second interlayer insulating layer;

forming contact holes through the moisture diffusion protection film and the second interlayer insulating layer to expose the first contact and the capacitor; and forming a wiring layer on the moisture diffusion protection film and in the contact holes to provide electrical connection between the first contact and the capacitor, wherein said forming the wiring layer occurs after said forming the moisture diffusion protection film.

12. The method of manufacturing a semiconductor device of claim 11, wherein the first contact is electrically connected to a gate electrode of the transistor.

13. The method of manufacturing a semiconductor device of claim 12, further comprising:

forming a second contact through the first interlayer insulating layer to be electrically connected to a source/drain region of the transistor, wherein a bottom electrode of the capacitor is formed to be on the second contact.

14. The method of manufacturing a semiconductor device of claim 11, further comprising:

forming a third interlayer insulating layer over the wiring layer and the moisture diffusion protection film, and forming a second wiring layer on and through the third interlayer insulating layer to be in electrical contact with the wiring layer.

15. The method of manufacturing a semiconductor device of claim 14, further comprising forming a protective layer over the second wiring layer and the third interlayer insulating layer.

16. A method of manufacturing a semiconductor device comprising:

forming a transistor on a substrate;

forming a first interlayer insulating layer over the transistor and the substrate;

forming a first contact through the first interlayer insulating layer to the transistor;

forming a capacitor over the first interlayer insulating layer;

forming a second interlayer insulating layer over the capacitor and the first interlayer insulating layer;

forming a moisture diffusion protection film on the second interlayer insulating layer in two stages including a first stage at a first RF power and a following second stage at a second RF power, wherein the second RF power is greater than the first RF power;

forming contact holes through the moisture diffusion protection film and the second interlayer insulating layer to expose the first contact and the capacitor; and forming a wiring layer on the moisture diffusion protection film and in the contact holes to provide electrical connection between the first contact and the capacitor, wherein said forming the wiring layer occurs after said forming the moisture diffusion protection film.

17. The method of manufacturing a semiconductor device of claim 16, wherein the first contact is electrically connected to a gate electrode of the transistor.

18. The method of manufacturing a semiconductor device of claim 17, further comprising:

forming a second contact through the first interlayer insulating layer to be electrically connected to a source/drain region of the transistor, wherein a bottom electrode of the capacitor is formed to be on the second contact.

19. The method of manufacturing a semiconductor device of claim 16, further comprising:

forming a third interlayer insulating layer over the wiring layer and the moisture diffusion protection film, and forming a second wiring layer on and through the third interlayer insulating layer to be in electrical contact with the wiring layer.

20. The method of manufacturing a semiconductor device of claim 19, further comprising forming a protective layer over the second wiring layer and the third interlayer insulating layer.

* * * * *